United States Patent
Chiu et al.

(10) Patent No.: US 11,765,983 B2
(45) Date of Patent: Sep. 19, 2023

(54) SEMICONDUCTOR DEVICE AND METHOD FOR FABRICATING THE SAME

(71) Applicant: UNITED MICROELECTRONICS CORP., Hsin-Chu (TW)

(72) Inventors: Chiu-Jung Chiu, Tainan (TW); Ya-Sheng Feng, Tainan (TW); I-Ming Tseng, Kaohsiung (TW); Yi-An Shih, Changhua County (TW); Yu-Chun Chen, Kaohsiung (TW); Yi-Hui Lee, Taipei (TW); Chung-Liang Chu, Kaohsiung (TW); Hsiu-Hao Hu, Keelung (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 17/972,542

(22) Filed: Oct. 24, 2022

(65) Prior Publication Data

US 2023/0040932 A1 Feb. 9, 2023

Related U.S. Application Data

(63) Continuation of application No. 16/988,707, filed on Aug. 9, 2020, now Pat. No. 11,515,471.

(30) Foreign Application Priority Data

Jul. 7, 2020 (CN) .......................... 202010645970.2

(51) Int. Cl.
*H10N 50/80* (2023.01)
*H10B 61/00* (2023.01)
(Continued)

(52) U.S. Cl.
CPC ............. *H10N 50/80* (2023.02); *H10B 61/00* (2023.02); *H10N 50/01* (2023.02); *H10N 50/85* (2023.02)

(58) Field of Classification Search
CPC ........ H10N 50/80; H10N 50/01; H10N 50/85; H10B 61/00
See application file for complete search history.

(56) References Cited

U.S. PATENT DOCUMENTS

2011/0014500 A1 1/2011 Horng
2011/0133299 A1* 6/2011 Zhu ........................ H10N 50/85
365/158

(Continued)

FOREIGN PATENT DOCUMENTS

WO 2017/155508 9/2017

OTHER PUBLICATIONS

Liu, Title: High thermal stability in W/MgO/CoFeB/W/CoFeB/W stacks via ultrathin W insertion with perpendicular magnetic anisotropy; Journal of Magnetism and Magnetic Materials 410 (2016) 123-127, 2016.

*Primary Examiner* — Marc Anthony Armand
(74) *Attorney, Agent, or Firm* — Winston Hsu (57) ABSTRACT

A method for fabricating semiconductor device includes the steps of forming an inter-metal dielectric (IMD) layer on a substrate, forming a trench in the IMD layer, forming a synthetic antiferromagnetic (SAF) layer in the trench, forming a metal layer on the SAF layer, planarizing the metal layer and the SAF layer to form a metal interconnection, and forming a magnetic tunneling junction (MTJ) on the metal interconnection.

14 Claims, 9 Drawing Sheets

(51) Int. Cl.
*H10N 50/01* (2023.01)
*H10N 50/85* (2023.01)

(56) References Cited

U.S. PATENT DOCUMENTS

2016/0308119 A1    10/2016  Hsu et al.
2017/0279036 A1*    9/2017  Mo ..................... H10N 50/01
2021/0134882 A1     5/2021  Lin

* cited by examiner

SEMICONDUCTOR DEVICE AND METHOD FOR FABRICATING THE SAME

CROSS REFERENCE TO RELATED APPLICATIONS

This application is a continuation application of U.S. application Ser. No. 16/988,707, filed on Aug. 9, 2020. The content of the application is incorporated herein by reference.

BACKGROUND OF THE INVENTION

1. Field of the Invention

The invention relates to a semiconductor device and method for fabricating the same, and more particularly to a magnetoresistive random access memory (MRAM) and method for fabricating the same.

2. Description of the Prior Art

Magnetoresistance (MR) effect has been known as a kind of effect caused by altering the resistance of a material through variation of outside magnetic field. The physical definition of such effect is defined as a variation in resistance obtained by dividing a difference in resistance under no magnetic interference by the original resistance. Currently, MR effect has been successfully utilized in production of hard disks thereby having important commercial values. Moreover, the characterization of utilizing GMR materials to generate different resistance under different magnetized states could also be used to fabricate MRAM devices, which typically has the advantage of keeping stored data even when the device is not connected to an electrical source.

The aforementioned MR effect has also been used in magnetic field sensor areas including but not limited to for example electronic compass components used in global positioning system (GPS) of cellular phones for providing information regarding moving location to users. Currently, various magnetic field sensor technologies such as anisotropic magnetoresistance (AMR) sensors, GMR sensors, magnetic tunneling junction (MTJ) sensors have been widely developed in the market. Nevertheless, most of these products still pose numerous shortcomings such as high chip area, high cost, high power consumption, limited sensibility, and easily affected by temperature variation and how to come up with an improved device to resolve these issues has become an important task in this field.

SUMMARY OF THE INVENTION

According to an embodiment of the present invention, a method for fabricating semiconductor device includes the steps of forming an inter-metal dielectric (IMD) layer on a substrate, forming a trench in the IMD layer, forming a synthetic antiferromagnetic (SAF) layer in the trench, forming a metal layer on the SAF layer, planarizing the metal layer and the SAF layer to form a metal interconnection, and forming a magnetic tunneling junction (MTJ) on the metal interconnection.

According to another aspect of the present invention, a semiconductor device includes a metal interconnection on a substrate and a magnetic tunneling junction (MTJ) on the metal interconnection. Preferably, the metal interconnection includes a synthetic antiferromagnetic (SAF) layer;

These and other objectives of the present invention will no doubt become obvious to those of ordinary skill in the art after reading the following detailed description of the preferred embodiment that is illustrated in the various figures and drawings.

DETAILED DESCRIPTION

Figure 1:
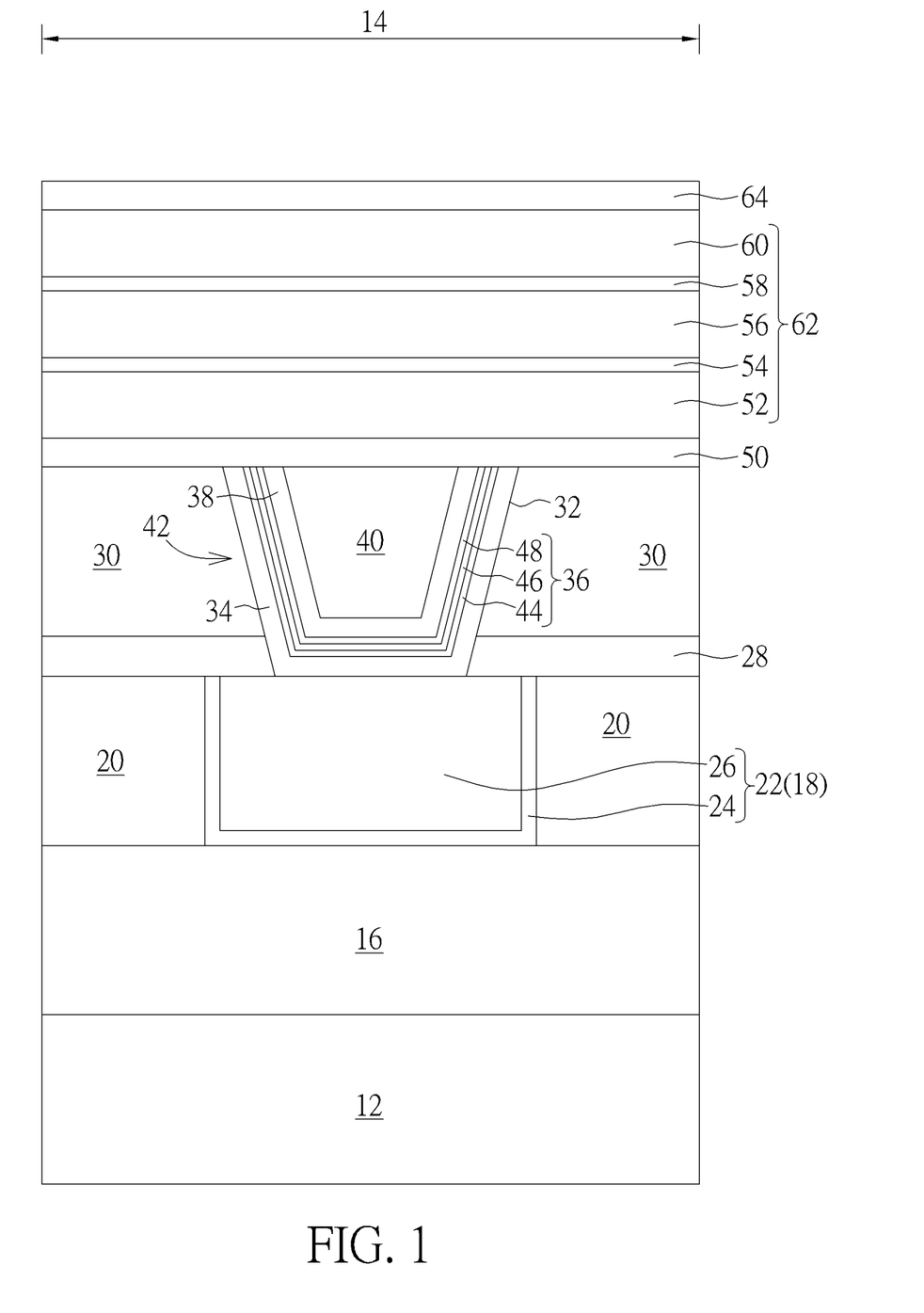
FIGS. 1-3 illustrate a method for fabricating a MRAM device according to an embodiment of the present invention.
Figure 2:
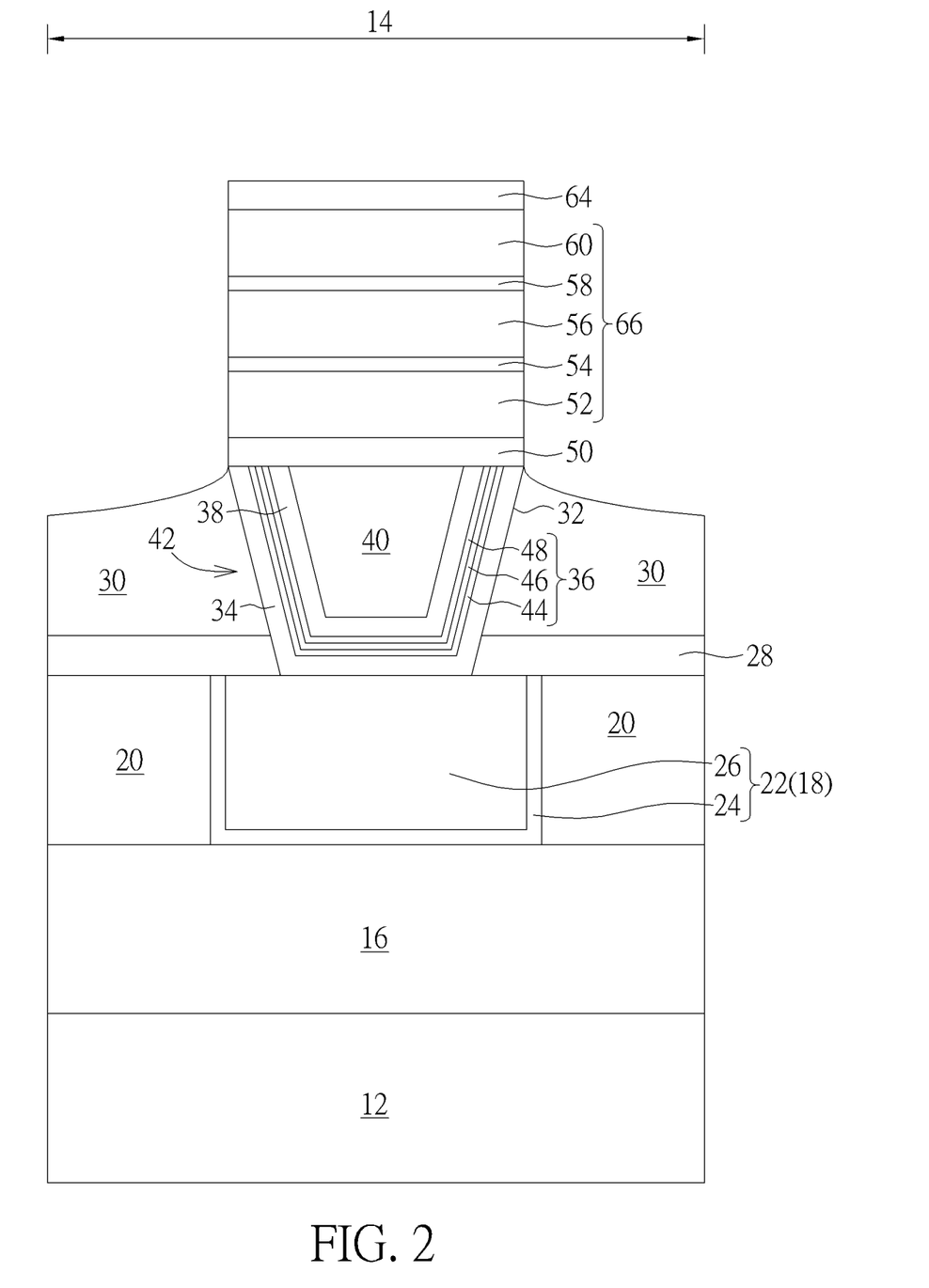
Figure 3:
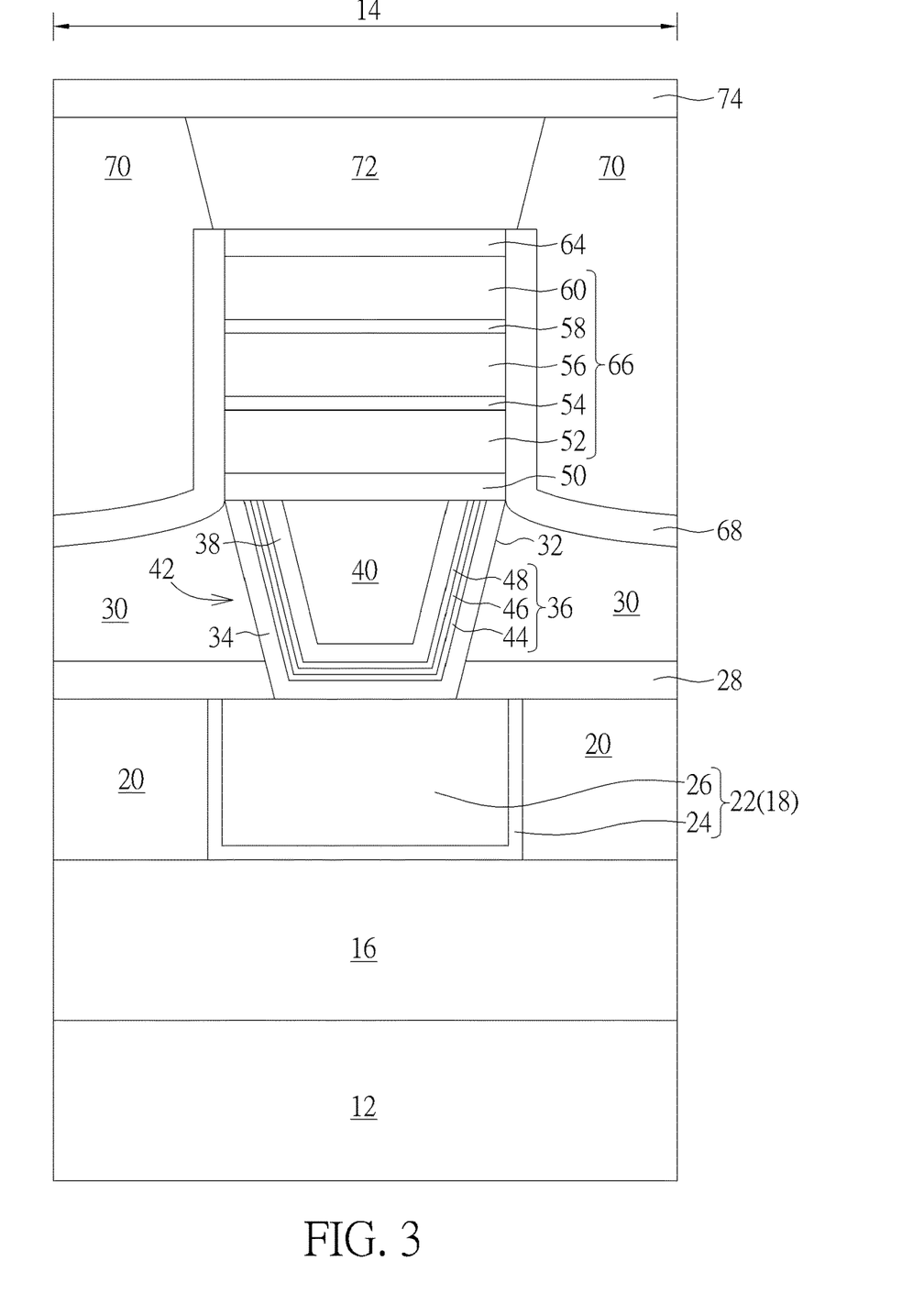

Referring to FIGS. 1-3, FIGS. 1-3 illustrate a method for fabricating a semiconductor device, or more specifically a MRAM device according to an embodiment of the present invention. As shown in FIG. 1, a substrate 12 made of semiconductor material is first provided, in which the semiconductor material could be selected from the group consisting of silicon (Si), germanium (Ge), Si-Ge compounds, silicon carbide (SiC), and gallium arsenide (GaAs), and a MRAM region 14 and a logic region (not shown) are defined on the substrate 12.

Active devices such as metal-oxide semiconductor (MOS) transistors, passive devices, conductive layers, and interlayer dielectric (ILD) layer 16 could also be formed on top of the substrate 12. More specifically, planar MOS transistors or non-planar (such as FinFETs) MOS transistors could be formed on the substrate 12, in which the MOS transistors could include transistor elements such as gate structures (for example metal gates) and source/drain region, spacer, epitaxial layer, and contact etch stop layer (CESL). The ILD layer 16 could be formed on the substrate 12 to cover the MOS transistors, and a plurality of contact plugs could be formed in the ILD layer 16 to electrically connect to the gate structure and/or source/drain region of MOS transistors. Since the fabrication of planar or non-planar transistors and ILD layer is well known to those skilled in the art, the details of which are not explained herein for the sake of brevity.

Next, a metal interconnect structure 18 is formed on the ILD layer 16 to electrically connect the aforementioned contact plugs, in which the metal interconnect structure 18 includes an inter-metal dielectric (IMD) layer 20 and at least a metal interconnection 22 embedded in the IMD layer 20. In this embodiment, the metal interconnection 22 from the metal interconnect structure 18 preferably includes a trench conductor and each of the metal interconnections 22 from the metal interconnect structure 18 could be embedded within the IMD layers 20 according to a single damascene process or dual damascene process. For instance, each of the metal interconnections 22 could further include a barrier layer 24 and a metal layer 26, in which the barrier layer 24 could be selected from the group consisting of titanium (Ti), titanium nitride (TiN), tantalum (Ta), and tantalum nitride (TaN) and the metal layer 26 could be selected from the group consisting of tungsten (W), copper (Cu), aluminum (Al), titanium aluminide (TiAl), and cobalt tungsten phosphide (CoWP). Since single damascene process and dual damascene process are well known to those skilled in the art, the details of which are not explained herein for the sake of brevity. In this embodiment, the metal layer 26 in the metal interconnection 22 is preferably made of copper and the IMD layer 20 is preferably made of silicon oxide or ultra low-k (ULK) dielectric layer, but not limited thereto.

Next, a stop layer 28 and another IMD layer 30 are formed on the IMD layer 20, and a photo-etching process is conducted to remove part of the IMD layer 30 to form at least a trench 32 in the IMD layer 30. Next, a barrier layer 34, a synthetic antiferromagnetic (SAF) layer 36, another barrier layer 38, and a metal layer 40 are formed in the trench 32 to fill the trench 32 completely, and a planarizing process such as chemical mechanical polishing (CMP) process is conducted to remove part of the metal layer 40, part of the barrier layer 38, part of the SAF layer 36, and part of the barrier layer 34 to form a metal interconnection 42 or contact plug in the trench 32.

In this embodiment, the SAF layer 36 preferably includes a composite structure capable of generating reverse magnetic field. For instance, the SAF layer 36 could further include a first ferromagnetic layer 44, a spacer 46 on the first ferromagnetic layer 44, and a second ferromagnetic layer 48 on the spacer 46, in which the first ferromagnetic layer 44 and the second ferromagnetic layer 48 preferably include ferromagnetic material such as cobalt-iron-bon (CoFeB) and the spacer 46 preferably includes non-magnetic material such as ruthenium (Ru).

Typically, as the thickness of the barrier layer in the metal interconnection directly under MTJ increases, the exchange coupling between reference layer and pinned layer within the MTJ also decreases accordingly thereby affecting the magnetic performance of the device. To resolve this issue the present invention preferably forms a SAF layer 36 between two barrier layers 34 and 38 and by using the antiferromagnetic field generated by the SAF layer 36 to balance the stray field of the MTJ formed afterwards, it would be desirable to prevent reduction of exchange coupling between reference layer and pinned layer and improve the magnetic performance of the device.

Similar to the metal interconnection 22, the metal interconnection 42 formed at this stage could be formed in the IMD layer 30 according to a single damascene process or dual damascene process, in which the lower barrier layer 34 preferably includes metal such as titanium (Ti) while the upper barrier layer 38 includes metal nitride such as titanium nitride (TiN). Nevertheless, according to other embodiments of the present invention the barrier layers 34, 38 could also be selected from the group consisting of titanium (Ti), titanium nitride (TiN), tantalum (Ta), and tantalum nitride (TaN) and the metal layer 40 could be selected from the group consisting of tungsten (W), copper (Cu), aluminum (Al), titanium aluminide (TiAl), and cobalt tungsten phosphide (CoWP). The stop layer 28 could include nitrogen doped carbide (NDC), silicon nitride, silicon carbon nitride (SiCN), or combination thereof and the IMD layers 30 could include silicon oxide or ultra low-k (ULK) dielectric layer.

Next, a bottom electrode 50 is formed on the surface of the IMD layer 30 and metal interconnection 42, a MTJ stack 62 including a pinned layer 52, a spacer 54, a reference layer 56, a barrier layer 58, and a free layer 60 is formed on the bottom electrode 50, and a top electrode 64 is formed on the MTJ stack 62, in which the free layer 60 could further include a first free layer (not shown) disposed on the barrier layer 58, a stop layer (not shown) disposed on the first free layer, and a second free layer (not shown) disposed on the stop layer.

In this embodiment, the bottom electrode 50 and the top electrode 64 are preferably made of conductive material including but not limited to for example Ta, Pt, Cu, Au, Al, or combination thereof. The pinned layer 52 could be made of ferromagnetic material including but not limited to for example iron, cobalt, nickel, or alloys thereof such as cobalt-iron-boron (CoFeB) or cobalt-iron (CoFe), in which the pinned layer 52 is formed to fix or limit the direction of magnetic moment of adjacent layers. The spacer 54 could include metal including but not limited to for example Ta. The reference layer 56 is disposed between the pinned layer 54 and the barrier layer 58, in which the reference layer 56 could be made of ferromagnetic material including but not limited to for example iron, cobalt, nickel, or alloys thereof such as cobalt-iron-boron (CoFeB). The barrier layer 58 could be made of insulating material including but not limited to for example oxides such as aluminum oxide ($AlO_x$) or magnesium oxide (MgO). The free layer 60 including the first free layer and the second free layer could be made of ferromagnetic material including but not limited to for example iron, cobalt, nickel, or alloys thereof such as cobalt-iron-boron (CoFeB), in which the magnetized direction of the free layer 60 could be altered freely depending on the influence of outside magnetic field.

Next, as shown in FIG. 2, one or more etching process is conducted by using a patterned hard mask (not shown) as mask (not shown) to remove part of the top electrode 64, part of the MTJ stack 62, part of the bottom electrode 50, and part of the IMD layer 30 for forming a MTJ 66 on the metal interconnection 42. It should be noted that a reactive ion etching (ME) process and/or an ion beam etching (IBE) process could be conducted to pattern the MTJ stack 62 and IMD layer 30 and due to the characteristics of the IBE process, the top surface of the remaining IMD layer 30 could be slightly lower than the top surface of the metal interconnections 42 after the IBE process and the top surface of the IMD layer 30 also reveals a curve or an arc.

Next, as shown in FIG. 3, a cap layer 68 is formed on the MTJ 66 to cover the surface of the IMD layer 30, an IMD layer 70 is formed on the cap layer 68, and one or more photo-etching process is conducted to remove part of the IMD layer 70 and part of the cap layer 68 to form a contact hole (not shown) exposing the top electrode 64. Next, conductive materials are deposited into the contact hole and planarizing process such as CMP is conducted to form a metal interconnection 72 connecting the top electrodes 64 underneath. Next, another stop layer 74 is formed on the IMD layer 70 and covering the metal interconnections 72.

In this embodiment, the cap layer 68 preferably includes silicon nitride, but could also include other dielectric material including but not limited to for example silicon oxide, silicon oxynitride (SiON), or SiCN depending on the demand of the product. The stop layer 74 could include nitrogen doped carbide (NDC), silicon nitride, silicon carbon nitride (SiCN), and most preferably SiCN. Similar to the aforementioned metal interconnection 22, the metal interconnections 72 could be formed in the IMD layer 70 according to a single damascene process or dual damascene process. For instance, the metal interconnection 72 could further include a barrier layer and a metal layer, in which the barrier layer could be selected from the group consisting of titanium (Ti), titanium nitride (TiN), tantalum (Ta), and tantalum nitride (TaN) and the metal layer could be selected from the group consisting of tungsten (W), copper (Cu), aluminum (Al), titanium aluminide (TiAl), and cobalt tungsten phosphide (CoWP). This completes the fabrication of a semiconductor device according to an embodiment of the present invention.

Referring to FIGS. 4-9, FIGS. 4-9 illustrate a method for fabricating a semiconductor device, or more specifically a MRAM device according to an embodiment of the present invention. For simplicity purpose, elements from the aforementioned embodiments are labeled with same numberings.

Figure 4:
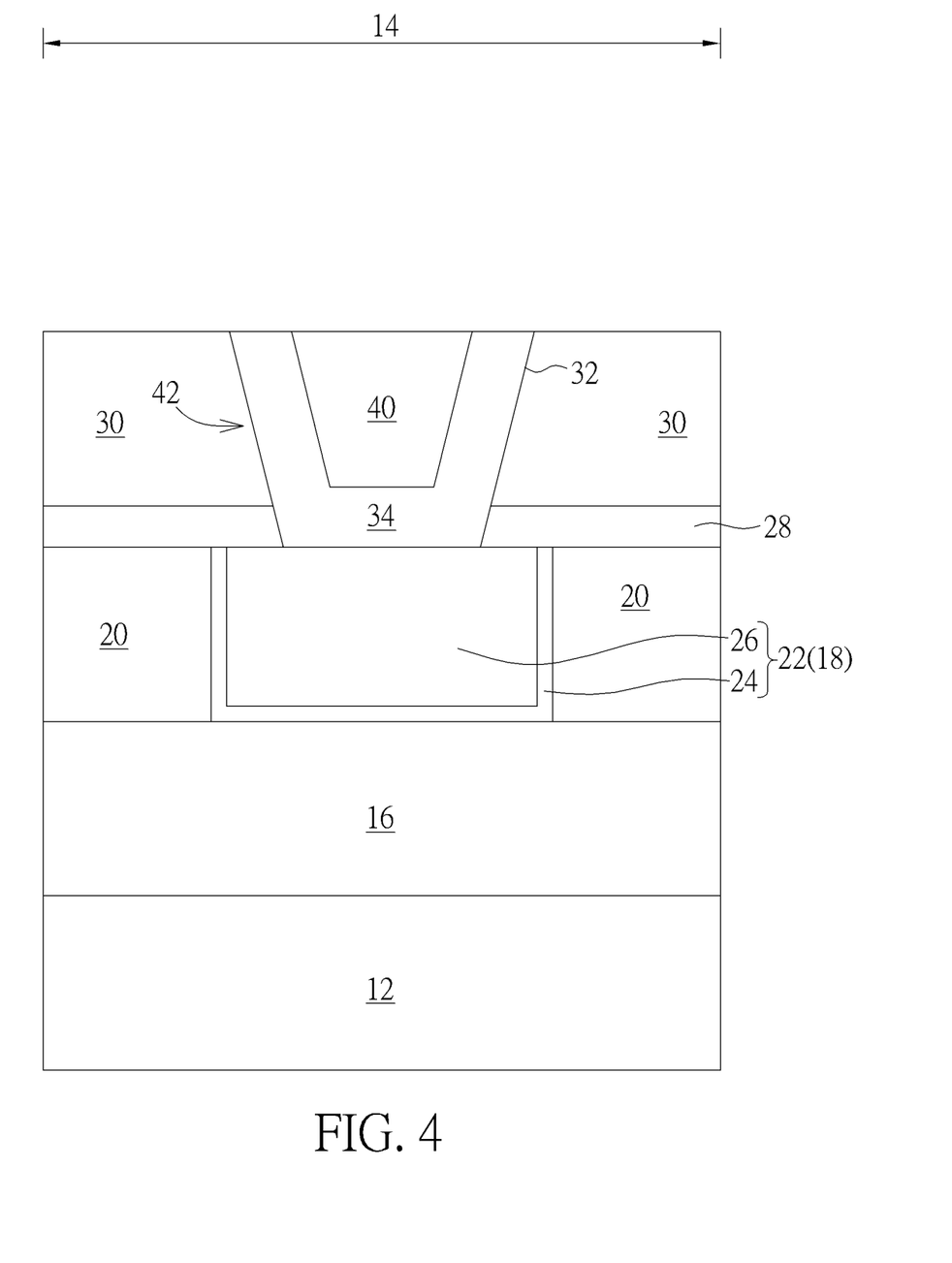
FIGS. 4-9 illustrate a method for fabricating a MRAM device according to an embodiment of the present invention.

As shown in FIG. 4, a substrate 12 made of semiconductor material is first provided, in which the semiconductor material could be selected from the group consisting of silicon (Si), germanium (Ge), Si—Ge compounds, silicon carbide (SiC), and gallium arsenide (GaAs), and a MRAM region 14 and a logic region (not shown) are defined on the substrate 12.

Active devices such as metal-oxide semiconductor (MOS) transistors, passive devices, conductive layers, and interlayer dielectric (ILD) layer 16 could also be formed on top of the substrate 12. More specifically, planar MOS transistors or non-planar (such as FinFETs) MOS transistors could be formed on the substrate 12, in which the MOS transistors could include transistor elements such as gate structures (for example metal gates) and source/drain region, spacer, epitaxial layer, and contact etch stop layer (CESL). The ILD layer 16 could be formed on the substrate 12 to cover the MOS transistors, and a plurality of contact plugs could be formed in the ILD layer 16 to electrically connect to the gate structure and/or source/drain region of MOS transistors. Since the fabrication of planar or non-planar transistors and ILD layer is well known to those skilled in the art, the details of which are not explained herein for the sake of brevity.

Next, a metal interconnect structure 18 is formed on the ILD layer 16 to electrically connect the aforementioned contact plugs, in which the metal interconnect structure 18 includes an inter-metal dielectric (IMD) layer 20 and at least a metal interconnection 22 embedded in the IMD layer 20. In this embodiment, the metal interconnection 22 from the metal interconnect structure 18 preferably includes a trench conductor and each of the metal interconnections 22 from the metal interconnect structure 18 could be embedded within the IMD layers 20 according to a single damascene process or dual damascene process. For instance, each of the metal interconnections 22 could further include a barrier layer 24 and a metal layer 26, in which the barrier layer 24 could be selected from the group consisting of titanium (Ti), titanium nitride (TiN), tantalum (Ta), and tantalum nitride (TaN) and the metal layer 26 could be selected from the group consisting of tungsten (W), copper (Cu), aluminum (Al), titanium aluminide (TiAl), and cobalt tungsten phosphide (CoWP). Since single damascene process and dual damascene process are well known to those skilled in the art, the details of which are not explained herein for the sake of brevity. In this embodiment, the metal layer 26 in the metal interconnection 22 is preferably made of copper and the IMD layer 20 is preferably made of silicon oxide or ultra low-k (ULK) dielectric layer, but not limited thereto.

Next, a stop layer 28 and another IMD layer 30 are formed on the IMD layer 20, and a photo-etching process is conducted to remove part of the IMD layer 30 to form at least a trench 32 in the IMD layer 30. Next, a barrier layer 34 and a metal layer 40 are formed in the trench 32 to fill the trench 32 completely, and a planarizing process such as chemical mechanical polishing (CMP) process is conducted to remove part of the metal layer 40 and part of the barrier layer 34 to form a metal interconnection 42 or contact plug in the trench 32.

Similar to the metal interconnection 22, the metal interconnection 42 formed at this stage could be formed in the IMD layer 30 according to a single damascene process or dual damascene process, in which the barrier layer 34 could also be selected from the group consisting of titanium (Ti), titanium nitride (TiN), tantalum (Ta), and tantalum nitride (TaN) and the metal layer 40 could be selected from the group consisting of tungsten (W), copper (Cu), aluminum (Al), titanium aluminide (TiAl), and cobalt tungsten phosphide (CoWP). The stop layer 28 could include nitrogen doped carbide (NDC), silicon nitride, silicon carbon nitride (SiCN), or combination thereof and the IMD layers 30 could include silicon oxide or ultra low-k (ULK) dielectric layer.

Figure 5:
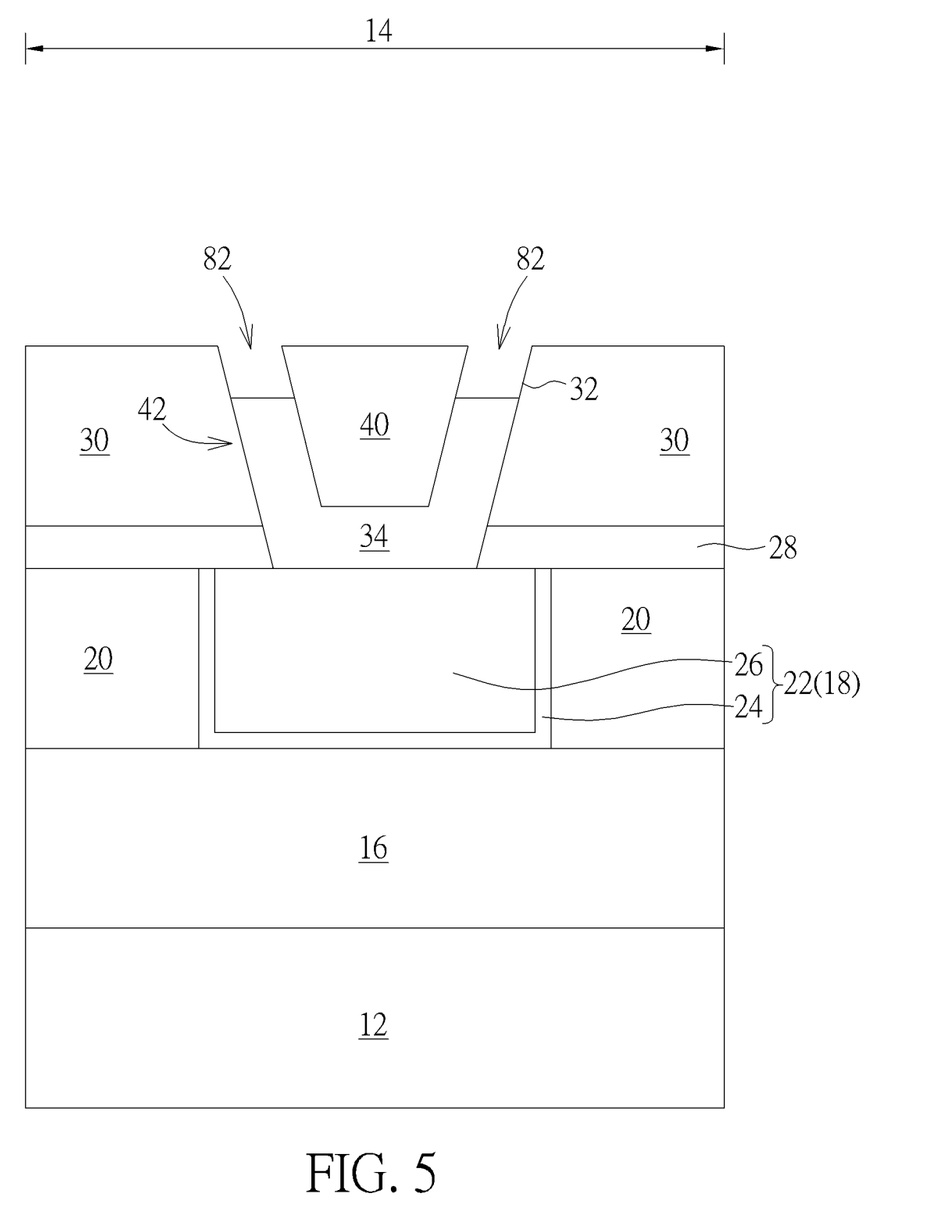

Next, as shown in FIG. 5, an etching process could be conducted by using the selectivity between the metal layer 40 and barrier layer 32 without forming any patterned mask to remove part of the barrier layer 32 for forming trenches 82 adjacent to two sides of the metal layer 40.

Figure 6:
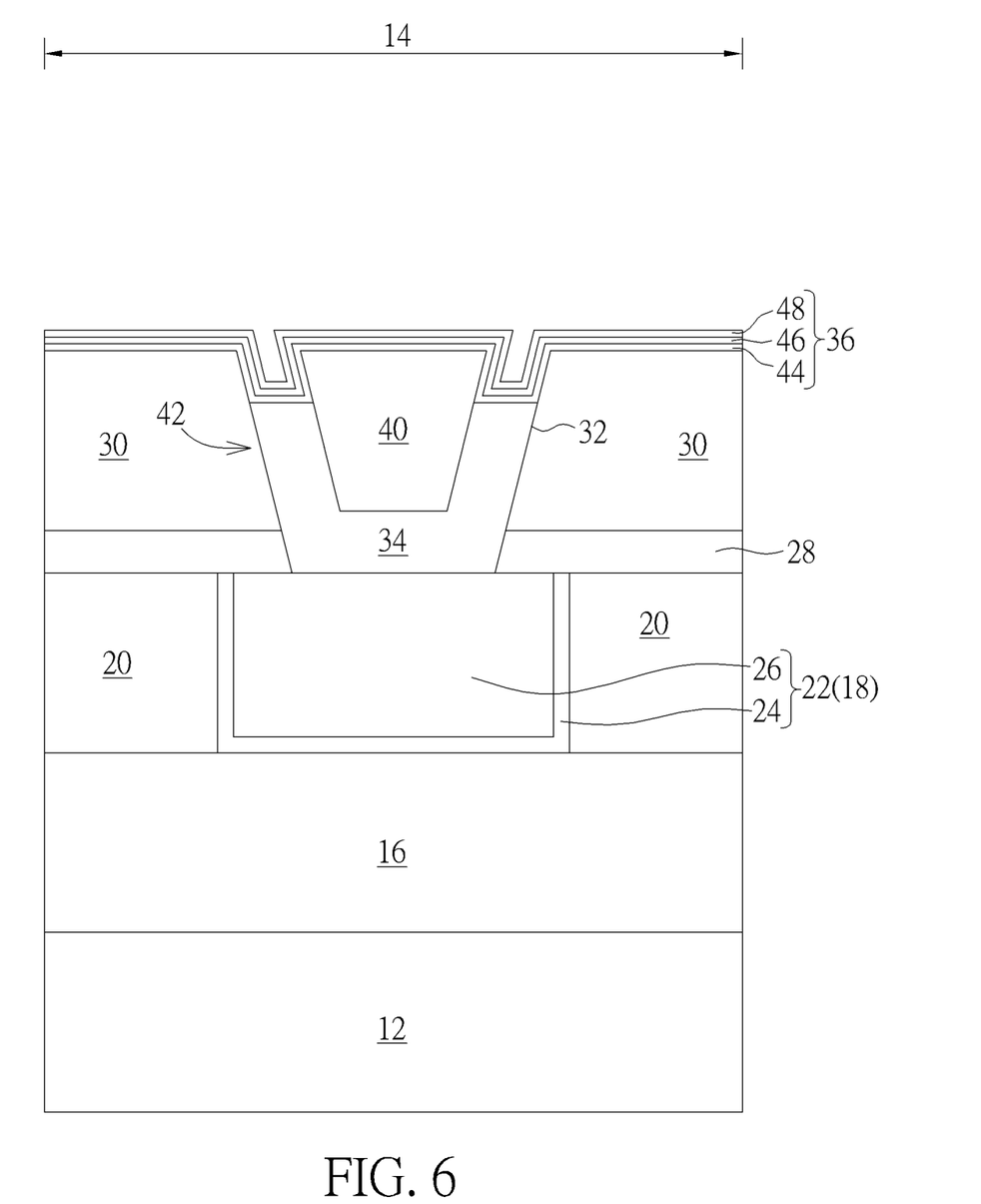

Next, as shown in FIG. 6, a SAF layer 36 is formed on the surface of the IMD layer 30 and metal layer 40 and filled into the trenches 82 without filling the trenches 82 completely. Similar to the aforementioned embodiment, the SAF layer 36 preferably includes a composite structure capable of generating reverse magnetic field. For instance, the SAF layer 36 could further include a first ferromagnetic layer 44, a spacer 46 on the first ferromagnetic layer 44, and a second ferromagnetic layer 48 on the spacer 46, in which the first ferromagnetic layer 44 and the second ferromagnetic layer 48 preferably include ferromagnetic material such as cobalt-iron-bon (CoFeB) and the spacer 46 preferably includes non-magnetic material such as ruthenium (Ru).

Figure 7:
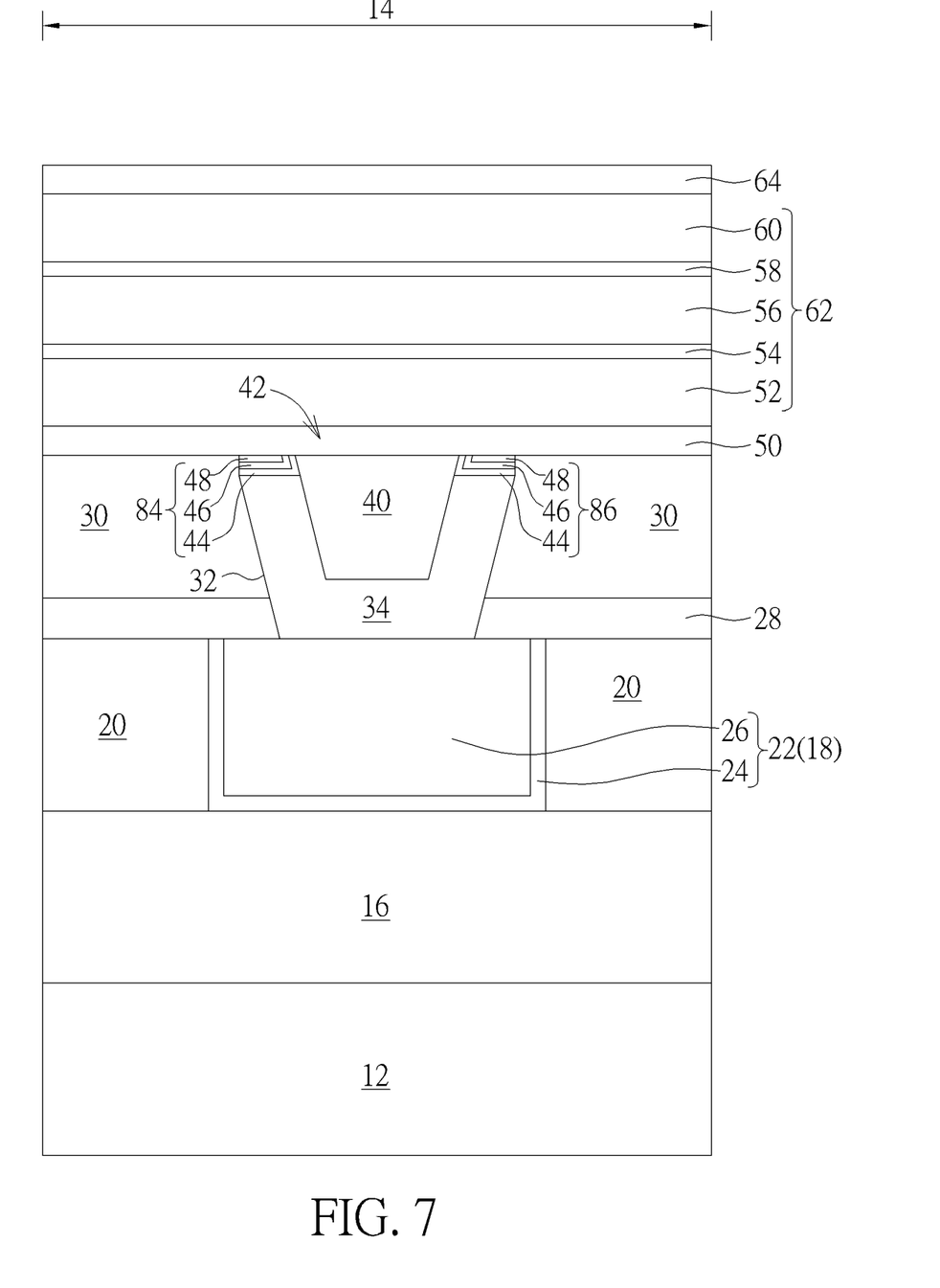

Next, as shown in FIG. 7, a planarizing process such as CMP is conducted to remove part of the SAF layer 36, part of the metal layer 40, and part of the IMD layer 30 to form a first SAF layer 84 adjacent to one side of the metal layer 40 and a second SAF layer 86 adjacent to another side of the metal layer 40. Structurally, the first ferromagnetic layer 44 and spacer 46 preferably include substantially L-shape cross-section after the planarizing process while the second ferromagnetic layer 48 includes horizontal I-shape cross-section, in which the top surfaces of the first ferromagnetic layer 44, the spacer 46, and the second ferromagnetic 48 are even with the top surfaces of the IMD layer 30 and metal layer 40. It should be further noted that even though the first SAF layer 84 and the second SAF layer 86 are disposed adjacent to two sides of the metal layer 40 if viewed from a cross-section perspective, the first SAF layer 84 and second SAF layer 86 are in fact belonging to a single structure surrounding the entire metal layer 40 if viewed from a top view perspective.

Next, a MTJ is formed on the metal interconnection 42, the first SAF layer 84, the second SAF layer 86, and the metal layer 40. For instance, a bottom electrode 50 is formed on the surface of the IMD layer 30 and metal interconnection 42, a MTJ stack 62 including a pinned layer 52, a spacer 54, a reference layer 56, a barrier layer 58, and a free layer 60 is formed on the bottom electrode 50, and a top electrode 64 is formed on the MTJ stack 62, in which the free layer 60 could further include a first free layer (not shown) disposed on the barrier layer 58, a stop layer (not shown) disposed on the first free layer, and a second free layer (not shown) disposed on the stop layer.

In this embodiment, the bottom electrode 50 and the top electrode 64 are preferably made of conductive material including but not limited to for example Ta, Pt, Cu, Au, Al, or combination thereof. The pinned layer 52 could be made of ferromagnetic material including but not limited to for example iron, cobalt, nickel, or alloys thereof such as cobalt-iron-boron (CoFeB) or cobalt-iron (CoFe), in which the pinned layer 52 is formed to fix or limit the direction of magnetic moment of adjacent layers. The spacer 54 could include metal including but not limited to for example Ta. The reference layer 56 is disposed between the pinned layer 54 and the barrier layer 58, in which the reference layer 56 could be made of ferromagnetic material including but not limited to for example iron, cobalt, nickel, or alloys thereof such as cobalt-iron-boron (CoFeB). The barrier layer 58 could be made of insulating material including but not limited to for example oxides such as aluminum oxide (AlO$_x$) or magnesium oxide (MgO). The free layer 60 including the first free layer and the second free layer could be made of ferromagnetic material including but not limited to for example iron, cobalt, nickel, or alloys thereof such as cobalt-iron-boron (CoFeB), in which the magnetized direction of the free layer 60 could be altered freely depending on the influence of outside magnetic field.

Figure 8:
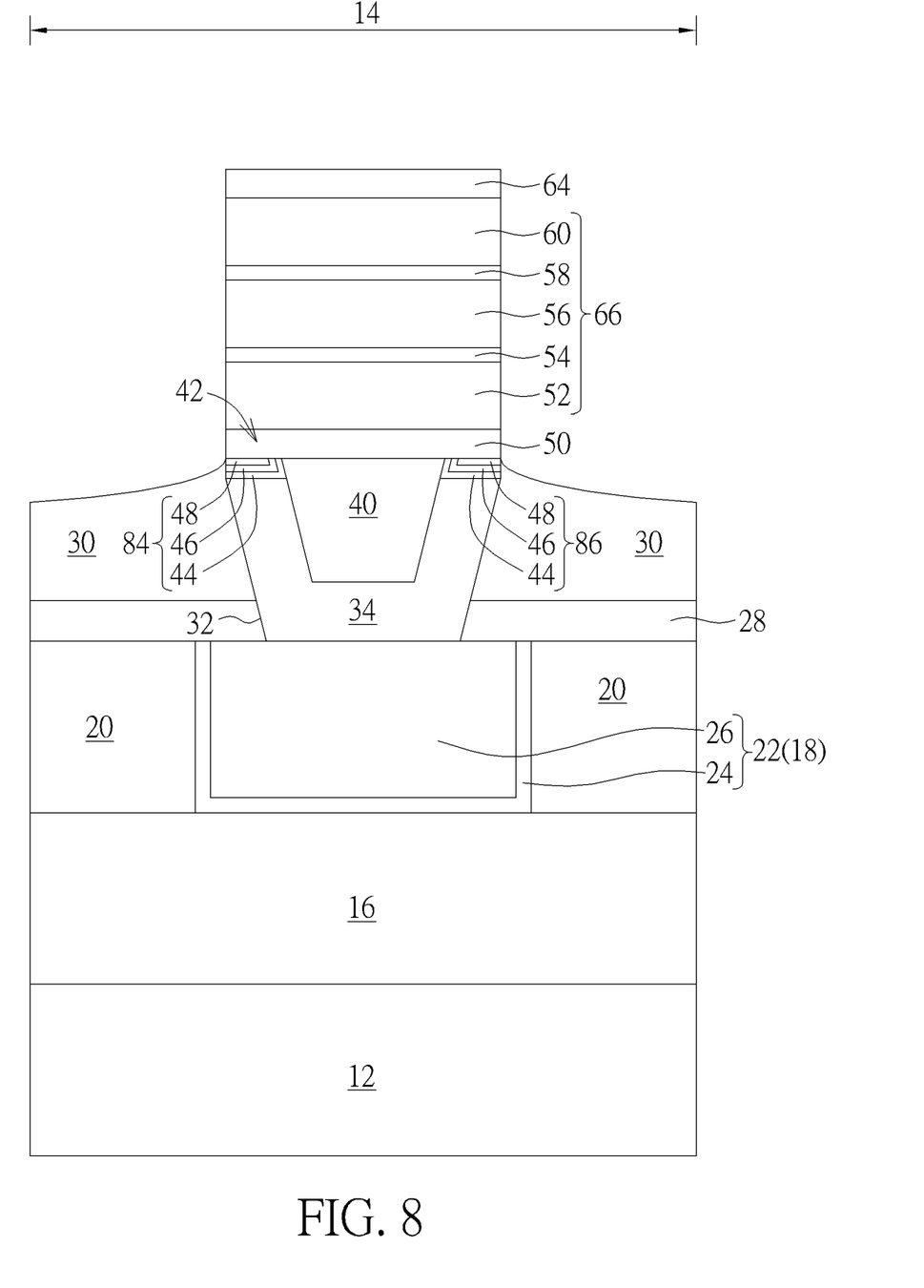

Next, as shown in FIG. 8, one or more etching process is conducted by using a patterned hard mask (not shown) as mask (not shown) to remove part of the top electrode 64, part of the MTJ stack 62, part of the bottom electrode 50, and part of the IMD layer 30 for forming a MTJ 66 on the metal interconnection 42. Similar to the aforementioned embodiment, a reactive ion etching (RIE) process and/or an ion beam etching (IBE) process could be conducted to pattern the MTJ stack 62 and IMD layer 30 and due to the characteristics of the IBE process, the top surface of the remaining IMD layer 30 could be slightly lower than the top surface of the metal interconnections 42 after the IBE process and the top surface of the IMD layer 30 also reveals a curve or an arc.

Figure 9:
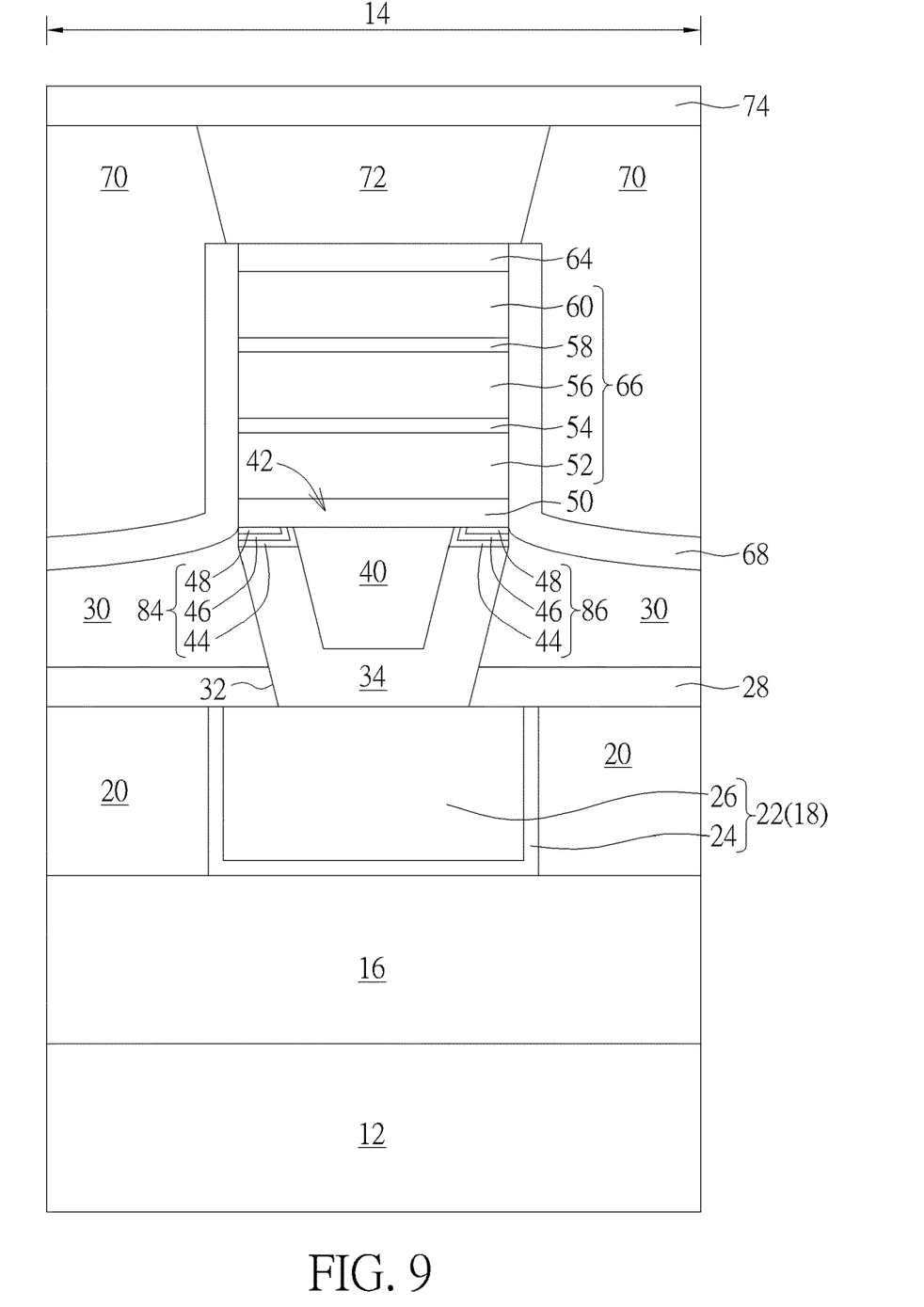

Next, as shown in FIG. 9, a cap layer 68 is formed on the MTJ 66 to cover the surface of the IMD layer 30, an IMD layer 70 is formed on the cap layer 68, and one or more photo-etching process is conducted to remove part of the IMD layer 70 and part of the cap layer 68 to form a contact hole (not shown) exposing the top electrode 64. Next, conductive materials are deposited into the contact hole and planarizing process such as CMP is conducted to form a metal interconnection 72 connecting the top electrodes 64 underneath. Next, another stop layer 74 is formed on the IMD layer 70 and covering the metal interconnections 72.

In this embodiment, the cap layer 68 preferably includes silicon nitride, but could also include other dielectric material including but not limited to for example silicon oxide, silicon oxynitride (SiON), or SiCN depending on the demand of the product. The stop layer 74 could include nitrogen doped carbide (NDC), silicon nitride, silicon carbon nitride (SiCN), and most preferably SiCN. Similar to the aforementioned metal interconnection 22, the metal interconnections 72 could be formed in the IMD layer 70 according to a single damascene process or dual damascene process. For instance, the metal interconnection 72 could further include a barrier layer and a metal layer, in which the barrier layer could be selected from the group consisting of titanium (Ti), titanium nitride (TiN), tantalum (Ta), and tantalum nitride (TaN) and the metal layer could be selected from the group consisting of tungsten (W), copper (Cu), aluminum (Al), titanium aluminide (TiAl), and cobalt tungsten phosphide (CoWP). This completes the fabrication of a semiconductor device according to an embodiment of the present invention.

Overall, as the thickness of the barrier layer in the metal interconnection directly under MTJ increases, the exchange coupling between reference layer and pinned layer within the MTJ also decreases accordingly thereby affecting the magnetic performance of the device. To resolve this issue the present invention preferably forms at least a SAF layer such as the SAF layer 36 having U-shape cross-section between two barrier layers 34, 38 in FIGS. 1-3 or a first SAF layer 84 and second SAF layer 86 adjacent to two sides of the metal layer 40 in FIGS. 4-9. By using the antiferromagnetic field generated by the SAF layer to balance the stray field of the MTJ formed afterwards, it would be desirable to prevent reduction of exchange coupling between reference layer and pinned layer and improve the magnetic performance of the device.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating semiconductor device, comprising:
    forming an inter-metal dielectric (IMD) layer on a substrate; forming a trench in the IMD layer;
    forming a synthetic antiferromagnetic (SAF) layer in the trench;
    forming a metal layer on the SAF layer;
    planarizing the metal layer and the SAF layer to form a metal interconnection; and
    forming a magnetic tunneling junction (MTJ) on the metal interconnection.

2. The method of claim 1, further comprising:
    forming a first barrier layer in the trench;
    forming the SAF layer on the first barrier layer; and
    forming a second barrier layer on the SAF layer.

3. The method of claim 2, wherein the first barrier layer comprises titanium (Ti).

4. The method of claim 2, wherein the second barrier layer comprises titanium nitride (TiN).

5. The method of claim 1, wherein the SAF layer comprises:
    a first ferromagnetic layer;
    a spacer on the first ferromagnetic layer; and
    a second ferromagnetic layer on the spacer.

6. The method of claim 5, wherein the first ferromagnetic layer and the second ferromagnetic layer comprise cobalt-iron-boron (CoFeB).

7. The method of claim 5, wherein the spacer comprises a non-magnetic layer.

8. A semiconductor device, comprising:
    a metal interconnection on a substrate, wherein the metal interconnection comprises a synthetic antiferromagnetic (SAF) layer;
    an inter-metal dielectric (IMD) layer around the metal interconnection; and
    a magnetic tunneling junction (MTJ) on the metal interconnection, wherein a bottom surface of the MTJ is higher than a top surface of the IMD layer.

9. The semiconductor device of claim 8, wherein the metal interconnection comprises:
    a first barrier layer on the substrate;
    the SAF layer on the first barrier layer;
    a second barrier layer on the SAF layer; and
    a metal layer on the second barrier layer.

10. The semiconductor device of claim 9, wherein the first barrier layer comprises titanium (Ti).

11. The semiconductor device of claim 9, wherein the second barrier layer comprises titanium nitride (TiN).

12. The semiconductor device of claim 9, wherein the SAF layer comprises:
    a first ferromagnetic layer;
    a spacer on the first ferromagnetic layer; and
    a second ferromagnetic layer on the spacer.

13. The semiconductor device of claim 12, wherein the first ferromagnetic layer and the second ferromagnetic layer comprise cobalt-iron-boron (CoFeB).

14. The semiconductor device of claim 12, wherein the spacer comprises a non-magnetic layer.

* * * * *